United States Patent
Hou et al.

(10) Patent No.: US 10,840,444 B2
(45) Date of Patent: *Nov. 17, 2020

(54) PHASE CHANGE MEMORY APPARATUS

(71) Applicants: Tsinghua University, Beijing (CN); HON HAI PRECISION INDUSTRY CO., LTD., New Taipei (TW)

(72) Inventors: Ji-Wei Hou, Beijing (CN); Zhi-Quan Yuan, Beijing (CN); Kai Liu, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/887,079

(22) Filed: Feb. 2, 2018

(65) Prior Publication Data

US 2018/0342673 A1 Nov. 29, 2018

(30) Foreign Application Priority Data

May 25, 2017 (CN) .......................... 2017 1 0378936

(51) Int. Cl.
*H01L 45/00* (2006.01)
*G11C 13/00* (2006.01)
*G11C 11/56* (2006.01)

(52) U.S. Cl.
CPC ...... *H01L 45/1286* (2013.01); *G11C 13/0004* (2013.01); *G11C 13/0038* (2013.01); *G11C 13/0069* (2013.01); *G11C 13/0097* (2013.01); *H01L 45/06* (2013.01); *H01L 45/146* (2013.01); *G11C 11/5678* (2013.01); *G11C 2013/008* (2013.01); *G11C 2213/16* (2013.01); *G11C 2213/32* (2013.01); *G11C 2213/34* (2013.01)

(58) Field of Classification Search
CPC ............ H01L 45/1286; G11C 11/5678; G11C 13/0004; G11C 13/0038
USPC ....................................................... 365/148
See application file for complete search history.

(56) References Cited

U.S. PATENT DOCUMENTS

| | | | |
|---|---|---|---|
| 2004/0001374 A1* | 1/2004 | Tanaka | H01L 45/06 365/200 |
| 2012/0326109 A1 | 12/2012 | Liu et al. | |
| 2013/0101848 A1 | 4/2013 | Banerjee et al. | |
| 2013/0187113 A1 | 7/2013 | Martens et al. | |
| 2014/0301137 A1* | 10/2014 | Kim | G11C 13/0004 365/163 |
| 2016/0225818 A1 | 8/2016 | Toh et al. | |
| 2017/0031231 A1* | 2/2017 | Bhaskaran | G02F 1/0147 |
| 2018/0342296 A1* | 11/2018 | Hou | G11C 13/0069 |

FOREIGN PATENT DOCUMENTS

| | | |
|---|---|---|
| CN | 102231424 | 11/2011 |
| CN | 206163528 | 5/2017 |

* cited by examiner

*Primary Examiner* — Anthan Tran
(74) *Attorney, Agent, or Firm* — ScienBiziP, P.C.

(57) ABSTRACT

A phase change memory apparatus comprises at least one heating layer; and at least one phase change layer comprising a vanadium dioxide layer, wherein each of the at least one phase change layer is set corresponding to each of the at least one heating layer, the at least one heating layer is configured to heat the at least one phase change layer.

20 Claims, 7 Drawing Sheets ized herein by reference. The application is also related to copending applications entitled, "METHOD FOR WRITING READING AND ERASING DATA OF PHASE CHANGE MEMORY APPARATUS".

PHASE CHANGE MEMORY APPARATUS

CROSS-REFERENCE TO RELATED APPLICATIONS

This application claims all benefits accruing under 35 U.S.C. § 119 from China Patent Application 201710378936.1, filed on May 25, 2017 in the China Intellectual Property Office, disclosure of which is incorporated herein by reference. The application is also related to copending applications entitled, "METHOD FOR WRITING READING AND ERASING DATA OF PHASE CHANGE MEMORY APPARATUS".

BACKGROUND

1. Technical Field

The present disclosure relates to a phase change memory apparatus.

2. Description of Related Art

In terms of the next generation of non-volatile memory, phase change memory apparatus is a memory that utilizes the difference in conductivity of different phases of a phase change material to store information. Due to the advantages of faster response time, better durability, longer data retention time, etc., phase change memory apparatus has attracted a great deal of attention. Phase change memories are not only widely used in microelectronics field such as mobile phones, digital cameras, MP3 players and removable memory cards, but also have important applications in military fields such as aerospace and missile systems.

Generally, when the phase change memory apparatus is in the working state, a high current pulse with a narrow pulse width is applied to the phase change material to rapidly melt and quench the phase change material, which causes the phase change material to change from the crystalline state to the amorphous state. That is, the resistance of the phase change material changes from low resistance to high resistance, which is the writing process, where the high resistance amorphous is called RESET state that corresponds to data "0". When the phase change material is applied with a current pluse of moderate amplitude with a long pulse width, the phase change material changes from the amorphous state to the crystalline state. That is, the resistance of the phase change material changes from high resistance to low resistance, which is the erasing process, where the low resistance amorphous is called a SET state that corresponds to data "1".

However, the traditional phase change memory apparatus can only store $2^n$ kinds of data where the storage density is small, which can not meet actual needs of the market.

What is needed, therefore, is to provide a phase change memory apparatus that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
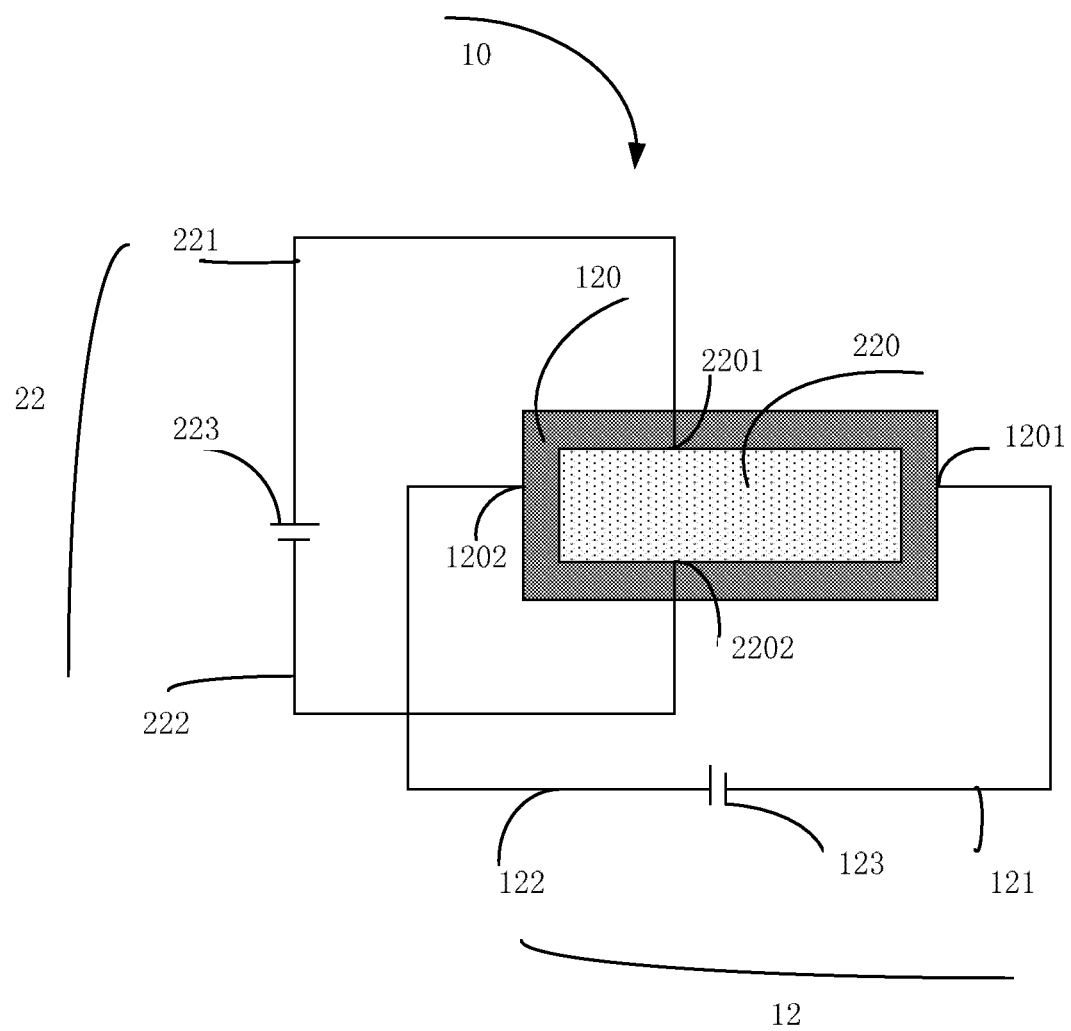
FIG. 1 shows a schematic drawing of one exemplary embodiment of a phase change memory apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

The present disclosure relates to a phase change memory apparatus described in detail as below.

A phase change memory apparatus according to one exemplary embodiment is provided. The phase change memory apparatus includes at least one heating layer and at least one phase change layer. The phase change layer includes a vanadium dioxide layer. Each of the at least one phase change layer is set corresponding to each of the at least one heating layer. The at least one heating layer is configured to heat the at least one phase change layer. The at least one heating layer is configured to heat the at least one phase change layer.

The number of the heating layers and the materials of the heating layer are not limited so as long as the heating layer generates heat. The heating layer can be a carbon nanotube structure or a resistance wire. The carbon nanotube structure includes a carbon nanotube film, a carbon nanotube wire, and a combination of the carbon nanotube film and the carbon nanotube wire. The carbon nanotube film can be a drawn carbon nanotube film, a pressed carbon nanotube film or a flocculated carbon nanotube film. The carbon nanotube wire includes untwisted carbon nanotube wire and twisted carbon nanotube wire.

The drawn carbon nanotube film includes a plurality of continuous and aligned carbon nanotube segments. The plurality of carbon nanotube segments are joined end to end by van der Waals forces. Each of the plurality of carbon nanotube segments includes a plurality of carbon nanotubes parallel to each other. The plurality of carbon nanotubes are joined end to end by van der Waals forces. The carbon nanotube segments have any length, thickness, uniformity and shape. The carbon nanotubes in the carbon nanotube film extend in the same direction. For a structure of the drawn carbon nanotube film and a method for making the drawn carbon nanotube film, please refer to the Chinese invention patent specification published on May 26, 2010 with the publication number CN101239712B.

The pressed carbon nanotube film can be obtained by rolling a carbon nanotube array in a certain direction or in different directions. A plurality of carbon nanotubes in the pressed carbon nanotube film are overlapped with each other. The pressed carbon nanotube film has preferred flexibility. The pressed carbon nanotube film is a self-supporting structure.

The flocculated carbon nanotube film includes a plurality of carbon nanotubes arranged in a disordered manner and uniformly distributed. A plurality of carbon nanotubes in the flocculated carbon nanotube film are entangled to each other by van der Waals forces. The flocculated carbon nanotube film has preferred flexibility. The flocculated carbon nanotube film is a self-supporting structure.

Referring to FIG. 1, one exemplary embodiment of the phase change memory apparatus 10 includes one heating layer 120 and one phase change layer 220. The phase change memory apparatus 10 further includes a first circuit 12 and a second circuit 22. The first circuit 12 includes a first power source 123, a first conducting wire 121, and a second conducting wire 122. The first circuit 12 is configured to apply electrical signal to the heating layer 120. The second circuit 22 includes a second power source 223, a third conducting wire 221, and a fourth conducting wire 222. The second circuit 22 is configured to apply electrical signal to the phase change layer 220.

The heating layer 120 includes a first end 1201 and a second end 1202. The first end 1201 is electrically connected to the first power source 123 through the first conducting wire 121, and the second end 1202 is electrically connected to the first power source 123 through the second conducting wire 122. The first power source 123 is turned on to apply a voltage to the heating layer 120, and the heating layer 120 generates heat. It can be understood that the working state of the heating layer 120 can be controlled by controlling power on and off of the first power source 123. In one exemplary embodiment, the heating layer 120 is the drawn carbon nanotube film, the plurality of carbon nanotubes in the drawn carbon nanotube film extend in a direction from the first conducting wire 121 to the second conducting wire 122.

The phase change layer 220 is disposed corresponding to the heating layer 120. Regardless of whether the phase change layer 220 and the heating layer 120 are in contact with each other, the heat generated by the heating layer 120 is transmitted to the phase change layer 220 to reach the phase transition temperature. In one exemplary embodiment, the plurality of phase change layers 220 is disposed corresponding to one heating layer 120.

The phase change layer 220 includes a third end 2201 and a fourth end 2202. The third end 2201 is electrically connected to the second power source 223 through the third conducting wire 221, and the fourth end 2202 is electrically connected to the second power source 223 through the fourth conducting wire 222. The second power source 223 applies a plurality of electrical signals to the phase change layer 220. In one exemplary embodiment, the phase change layer 220 and the heating layer 120 are stacked and in contact with each other.

The phase change layer 220 can be in a shape of a nanowire, a thin film, or a bulk. A size of the phase change layer 220 can be set according to actual needs. In one exemplary embodiment, the whole phase change layer 220 is covered by the heating layer 120.

The vanadium dioxide layer is a pure vanadium dioxide layer or a vanadium dioxide doped metal element layer. The metal element can be selected from a group consisting of tungsten, niobium, aluminum, chromium, and a combination of thereof. In one exemplary embodiment, the vanadium dioxide layer is a pure vanadium dioxide ($VO_2$) layer, and the phase transition temperature of the vanadium dioxide is about 68° C. An area of the phase change layer 220 is smaller than the area of the heating layer 120.

Figure 2:
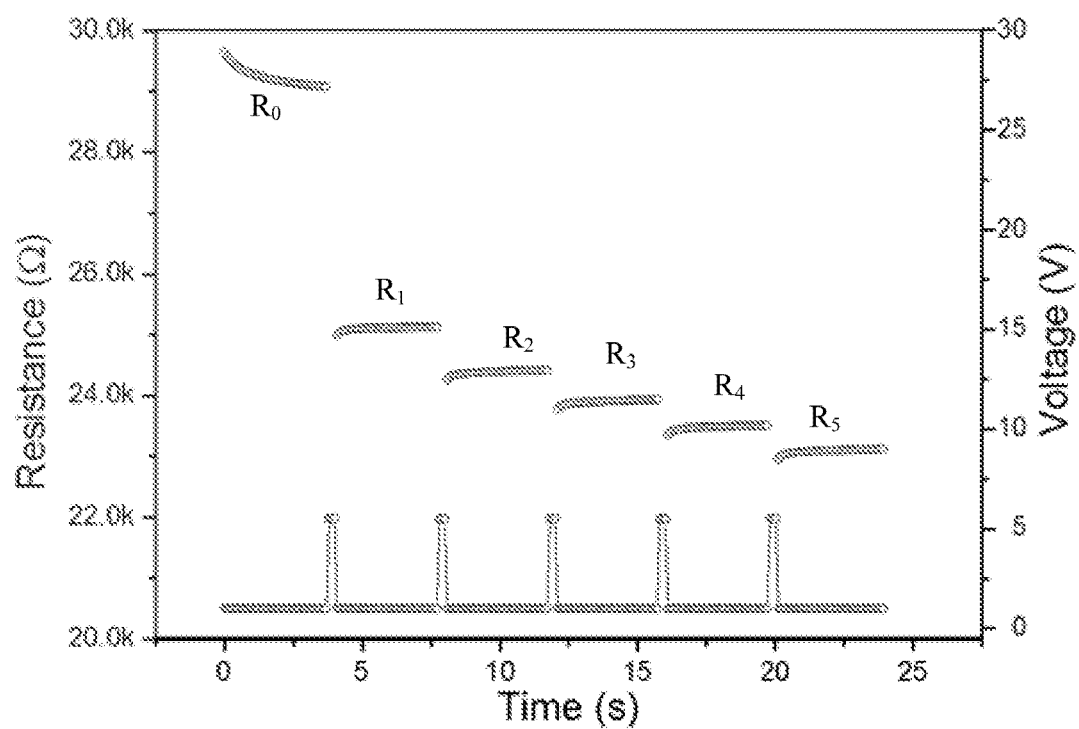
FIG. 2 shows a graph illustrating voltage-resistance changes of one exemplary embodiment of a vanadium dioxide input a voltage pulse signal with same voltage amplitudes.
Figure 3:
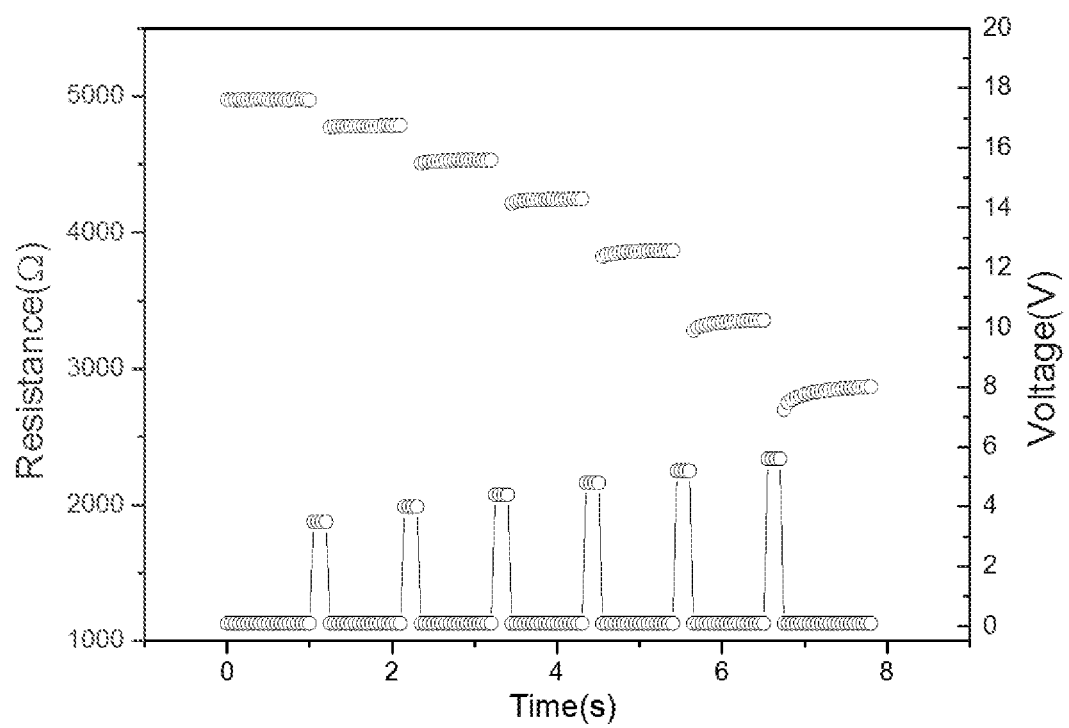
FIG. 3 shows a graph illustrating voltage-resistance changes of one exemplary embodiment of the vanadium dioxide input another voltage pulse signal with different voltage amplitudes.
Figure 4:
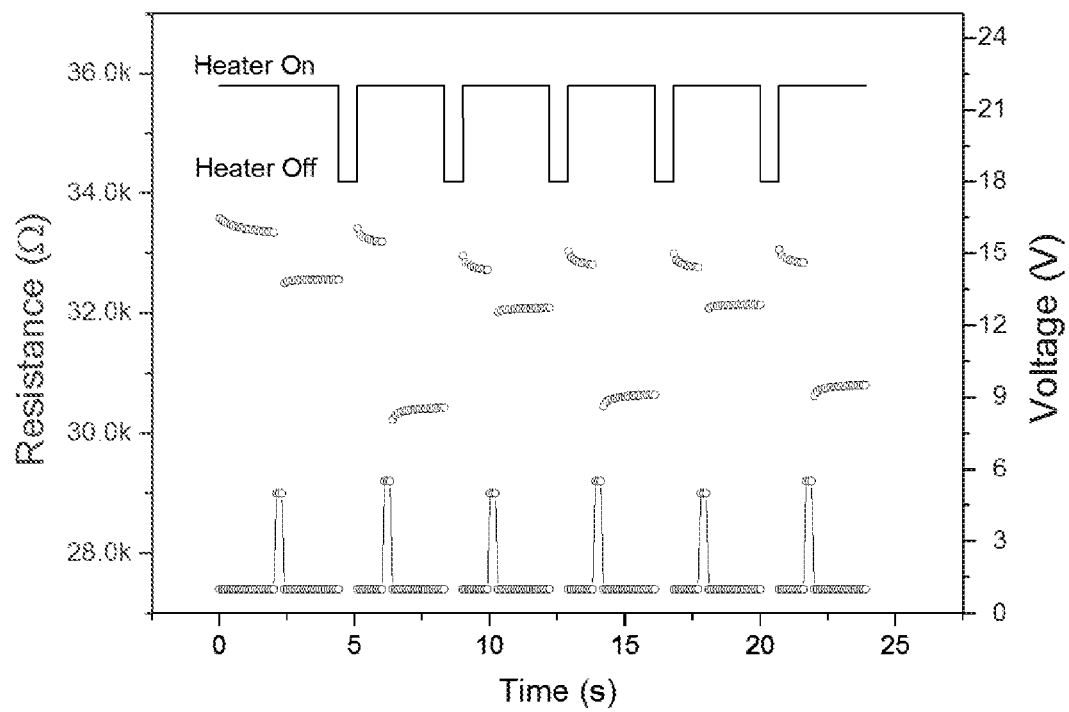
FIG. 4 shows a graph illustrating voltage-resistance changes of one exemplary embodiment of the vanadium dioxide when a heating layer is no longer heating during the input of a voltage signal.

Referring to FIG. 2, the heating layer 120 heats the phase change layer 220 to keep the phase change layer 220 at the phase change temperature. When the third end 2201 and the fourth end 2202 input a first electrical signal to the phase change layer 220, the resistance value of the phase change layer 220 decreases from original resistance $R_0$ to another resistance $R_1$ and keeps $R_1$ constant, and then continues to input a second electrical signal to the phase change layer 220, the resistance value of the phase change layer 220 decreases from $R_1$ to yet another resistance $R_2$ and keeps $R_2$ constant, and continues to input constantly electrical signal to the phase change layer 220, the resistance value of the phase change layer 220 gradually steps down to another resistance $R_5$. The electrical signals can be of the same voltage pulse signal or different voltage pulse signals. FIG. 3 shows resistance value changes of the phase change layer 220 when inputting the different voltage pulse signals. Referring to FIG. 4, when the heating layer 120 stops heating the phase change layer 220, the resistance value of the phase change layer 220 returns to the original resistance $R_0$.

According to the characteristics of the phase change layer 220, when the phase change layer 220 is kept near the phase transition temperature, and the resistance value of the phase change layer 220 can be controlled by inputting electrical signals, which can write multiple data into the phase change memory apparatus 10. When the phase change layer 220 is not kept near the phase transition temperature, the resistance value of the phase change layer 220 returns to the original resistance $R_0$, which can erase the writing data in the phase change memory apparatus 10.

The phase change memory apparatus 10 includes three process steps: writing data, reading data and erasing data. In initial state, the phase change layer 220 is an insulator with high resistivity, representing data "0". During the phase transition, the resistance value of the phase change layer 220 decreases in a stepwise manner. Each step has a resistance state, and the resistance states respectively represent data "1", "2", "3" . . . , which can realize multi-value storage.

A process of writing data into the phase change memory apparatus 10 includes:

inputting an electrical signal to the heating layer 120 to heat the phase change layer 220 until the phase change layer 220 reaches the phase transition temperature; and then applying a voltage to the phase change layer 220, in which a ratio of the metal domains and the insulator domains in the phase change layer 220 is changed to write a plurality of data.

A process of reading the writing data in the phase change memory apparatus 10 includes: inputting an electrical signal to the phase change layer 220, wherein the electrical signal is weak and does not cause phase transition of the phase change layer 220; and measuring current in the second circuit 22 at the same time, and obtaining the resistance value of the phase change layer 220. Because the resistance value corresponds to a representative data, thus multiple writing data can be read.

A process of erasing the writing data in the phase change memory apparatus 10 includes: stopping a voltage input to the heating layer 120, and the phase change layer 220 is transformed from a coexisting state comprising the metal phase and the insulator phase to an insulator phase, and the multiple writing data is erased.

The phase change layer 220 in the phase change memory apparatus 10 is a pure vanadium dioxide ($VO_2$) layer. The vanadium dioxide has both the metal phase and the insulator phase during phase change. When inputting different electrical signals into the $VO_2$ layer, the ratio of the metal domains and the insulator domains is changed, which results in a change in the resistance value of the $VO_2$ layer. The vanadium dioxide has a multi-resistance state and can realize multi-value storage of the phase change memory apparatus 10, which futher improves the storage density of the phase change memory apparatus 10. In addition, when the heating layer 120 stops heating the phase change layer 220, the writing data in the phase change memory apparatus 10 is erased.

Figure 5:
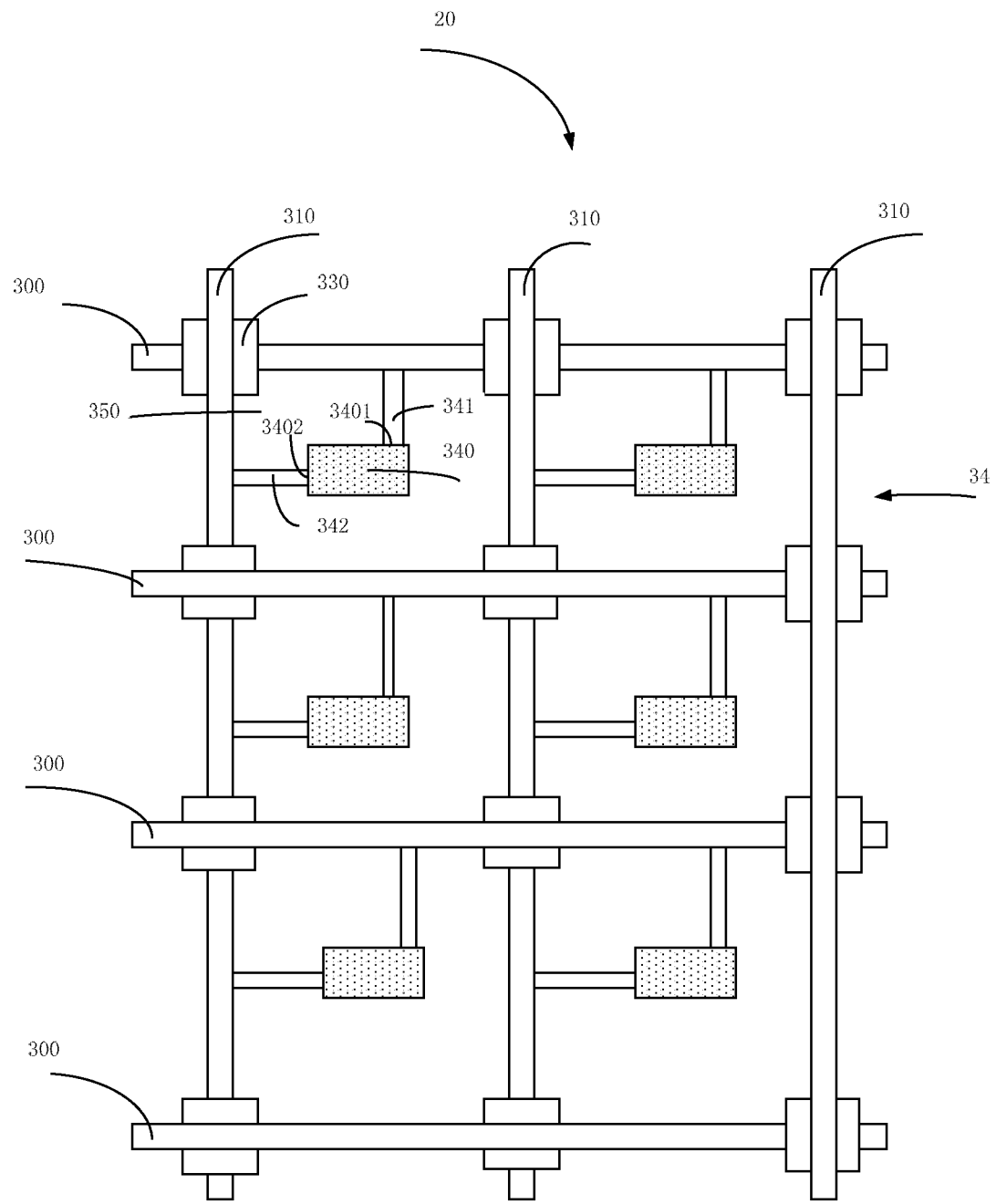
FIG. 5 is a top view of another exemplary embodiment of the phase change memory apparatus.
Figure 6:
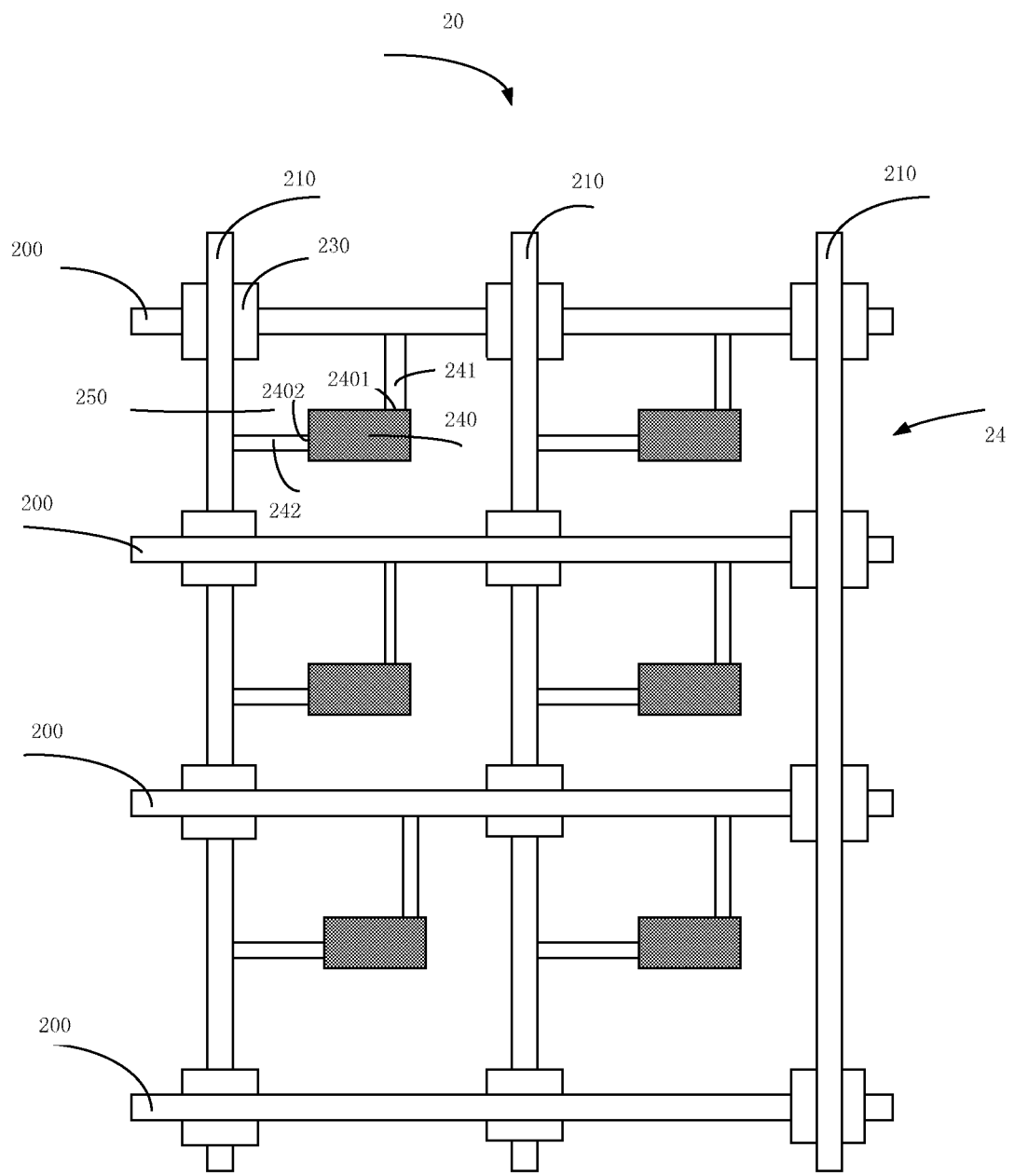
FIG. 6 is a bottom view of another exemplary embodiment of the phase change memory apparatus.

Referring to FIGS. 5-6, another exemplary embodiment of a phase change memory apparatus 20 is provided. The phase change memory apparatus 20 includes a plurality of heating layers 240 and a plurality of phase change layer 340. The phase change memory apparatus 20 further includes a third circuit 24 and a fourth circuit 34. The third circuit 24 includes a plurality of first row electrode leads 200, a plurality of first column electrode leads 210, a plurality of fifth conducting wires 241, and a plurality of sixth conducting wires 242. The plurality of first row electrode leads 200 are substantially parallel to each other. The plurality of first column electrode leads 210 are substantially parallel to each other. The plurality of first column electrode leads 210 and the plurality of first row electrode leads 200 are crossed and insulated from each other. Two adjacent first row electrode leads 200 and the two adjacent first column electrode leads 210 defines a first grid 250.

The heating layer 240 is located in the first grid 250. The heating layer 240 includes a fifth end 2401 and a sixth end 2402. The fifth end 2401 is electrically connected to the first row electrode leads 200 proximate to the fifth end 2401 through the fifth conducting wires 241. The sixth end 2402 is electrically connected to the first column electrode leads 210 proximate to the sixth end 2402 through the sixth conducting wire 242. The heating layers 240 in the same row are electrically connected with the same first row electrode lead 200 and the heating layer 240 in the same column is electrically connected with the same first column electrode lead 210. Each of the plurality of phase change layer 340 is disposed corresponding to each of the plurality of heating layers 240. The plurality of heating layers 240 heats the plurality of phase change layer 340.

The plurality of first column electrode leads 210 and the plurality of first row electrode leads 200 transmit electrical signals to the heating layer 240. An insulation layer 230 is disposed at the crossing of the first row electrode leads 200 and the first column electrode leads 210. Shapes, sizes and arrangements of the first column electrode leads 210 and the first row electrode leads 200 are not limited, as long as the voltage applied between the first row electrode 200 and the first column electrode 210 is transimitted to the heating layer 240 to generate heat.

The plurality of heating layers 240 is arranged in a plurality of rows and columns to form an array. Each of the plurality of heating layers 240 is separately disposed in each of the first grids 250. A working state of each of the heating layers 240 is controlled by individually inputting a voltage to each of the first row electrode leads 200 and the first column electrode leads 210. When different voltages are applied to the fifth end 2401 and the sixth end 2402 of the heating layer 240, the heating layer 240 generates heat to heat the phase change layer 340; when the same voltage is input to the fifth end 2401 and a sixth end 2402 of the heating layer 240, the heating layer 240 stops heating and erases writing data in the phase change memory apparatus 20.

The fourth circuit 34 includes a plurality of second row electrode leads 300, a plurality of second column electrode leads 310, a plurality of seventh conducting wires 341, and a plurality of eighth conducting wires 342. Each of the phase change layers 340 is located on each of the heating layers 240. The fourth circuit 34 can be set according to need and so as long as the electrical signal can be input to the phase change layer 340. The plurality of second row electrode leads 300 are parallel to each other. The plurality of second column electrode leads 310 are parallel to each other. The plurality of second column electrode leads 310 and the plurality of second row electrode leads 300 are perpendicular to each other and insulated from each other. Two adjacent second row electrode leads 300 and the two adjacent second column electrode leads 310 defines a second grid 350.

The phase change layer 340 is located in the second grids 350. The phase change layer 340 includes a seventh end 3401 and an eighth end 3402. The seventh end 3401 is electrically connected to the second row electrode leads 300 through the seventh conducting wire 341. The eighth end 3402 is electrically connected to the second column electrode leads 310 through the eighth conducting wire 342. The phase change layer 340 in the same row is electrically connected with the same second row electrode lead 300. The phase change layer 340 in the same column is electrically connected with the same second column electrode lead 310.

An insulation layer 330 is disposed at the crossing of the second row electrode leads 300 and the second column electrode leads 310. The plurality of phase change layers 340 are arranged in a plurality of rows and columns to form an array.

The vanadium dioxide layer is a doped vanadium dioxide ($VO_2$) layer. The phase transformation temperature of the vanadium dioxide layer can be changed by doping, such as doping element type and doping element ratio. The doping element can be selected from a group consisting of tungsten, niobium, aluminum, chromium, and a combination of thereof. In one exemplary embodiment, the phase change layer 340 comprises vanadium dioxide doped tungsten, wherein the doping percentage of tungsten is about 1.5%, which reduces heating power of the heating layer 240. The phase transformation temperature of the vanadium dioxide doped tungsten is about 30° C. An area of the doped vanadium dioxide ($VO_2$) layer is equal to an area of the carbon nanotube film.

The phase change memory apparatus 20 has many advantages. First, each of the heating layers 240 in the phase change memory apparatus 20 can work alone without affecting each other; and stopping the heating of the single heating layer 240 can achieve the data erasing of the single phase change layer 340. Furthermore, the phase change layer 340 is a doped vanadium dioxide layer, because the vanadium dioxide has multiple resistance states, which can increase the storage density of the phase change memory apparatus 20. Moreover, the phase transition temperature of the vanadium dioxide doped tungsten is lower, which can reduce the heating power of the heating layer 240.

Figure 7:
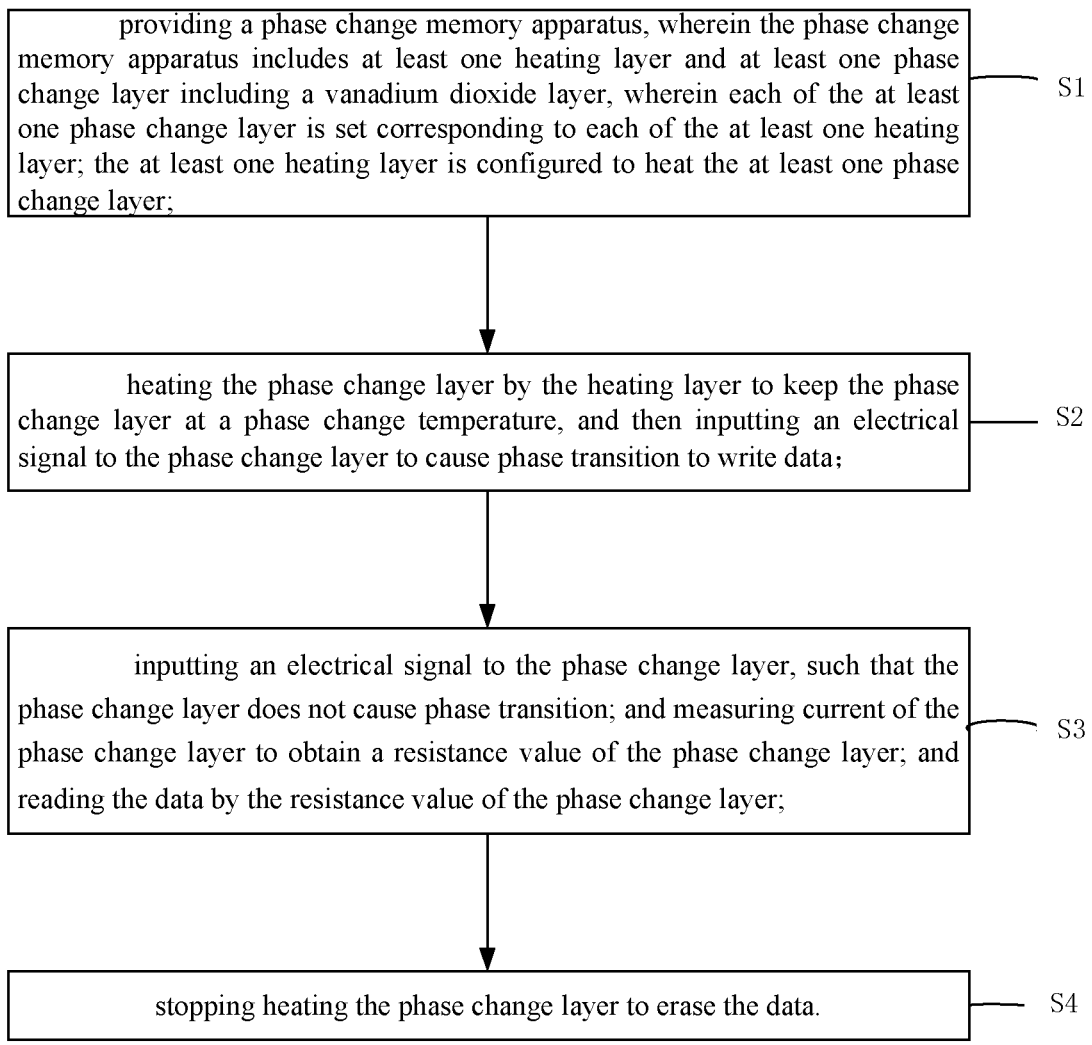
FIG. 7 shows a schematic drawing of another exemplary embodiment of a phase change memory apparatus.

Referring to FIG. 7, a method for writing data, reading data and erasing data of one exemplary embodiment of the phase change memory apparatus is provided. The method for writing, reading and erasing data of the phase change memory apparatus includes following steps:

S1, providing a phase change memory apparatus, wherein the phase change memory apparatus includes at least one heating layer and at least one phase change layer including a vanadium dioxide layer, wherein each of the at least one phase change layer is set corresponding to each of the at least one heating layer; the at least one heating layer is configured to heat the at least one phase change layer;

S2, heating the phase change layer by the heating layer to keep the phase change layer at a phase change temperature, and then inputting an electrical signal to the phase change layer to cause phase transition and to write data;

S3, inputting an electrical signal to the phase change layer, such that the phase change layer does not cause phase transition; and measuring current of the phase change layer to obtain a resistance value of the phase change layer; and reading the data by the resistance value of the phase change layer;

S4, stopping heating to the phase change layer to erase the data.

In step S1, the phase change memory apparatus can be the phase change memory apparatus described above.

In step S2, the heating layer heats the phase change layer continuously. In one exemplary embodiment, the heating layer generates heat by inputting voltages to the heating layer. An input voltage of the phase change layer can be controlled by controlling any one adjacent row electrode lead and one adjacent column electrode lead. When an electrical signal is input to the phase change layer, two sets of data can be written. When a plurality of electrical signals are input, the resistance value of the phase change layer changes many times to realize multiple data writing. The range of this electrical signal is about 5V to about 10V.

In step S3, the input electrical signal is a weaker electrical signal, which causes the phase change layer to change in resistance without a phase transition. The electrical signal is less than 2V. Each resistance value represents a data, and when a resistance value is obtained, a writing data corresponding to the resistance value can be obtained, and in turn, data is read.

In step S4, once a certain heating layer is controlled to stop heating the phase change layer, the phase change layer is not maintained near the phase transition temperature, and the writing data in the phase change layer is erased. In one exemplary embodiment, applying an equal voltage to two ends of the heating layer, the heating layer stops heating the phase change layer and so the phase change layer can not reach the phase change temperature, and in turn, data is erased.

The method for writing, reading and erasing data of the phase change memory apparatus has many advantages. The phase change layer comprises a vanadium dioxide material, and the vanadium dioxide has a plurality of resistance states, which can increase the storage density of the phase change memory apparatus. Moreover, doping the vanadium dioxide with metal element can reduce its phase transition temperature, further reduces the heating power of the heating layer. In addition, when the heating layer is distributed in an array, controlling one of the heating layers to stop heating one phase change layer can erase data of the single phase change layer.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A phase change memory apparatus, comprising:
at least one heating layer connected to a first power source; and
at least one phase change layer comprising a vanadium dioxide layer, wherein each of the at least one phase change layer is set corresponding to each of the at least one heating layer, the at least one heating layer is configured to heat the at least one phase change layer, and the at least one phase change layer is connected to a second power source; the first power source and the second power source are connected simultaneously; and the first power source is configured for inputting a writing data to the phase change memory apparatus by supplying a voltage input to the at least one heating layer, and erasing the writing data only by stopping supplying the voltage to the at least one heating layer, so that heat is stopped being transferred to the at least one phase change layer.

2. The phase change memory apparatus of claim 1, wherein the first power source is connected to the at least one heating layer by only a first conducting wire and a second conducting wire.

3. The phase change memory apparatus of claim 1, wherein the second power source is connected to the at least one phase change layer by only a third conducting wire and a fourth conducting wire.

4. The phase change memory apparatus of claim 1, wherein the at least one heating layer is a carbon nanotube film, a carbon nanotube wire, or a combination of thereof.

5. The phase change memory apparatus of claim 1, wherein the vanadium dioxide layer is a pure vanadium dioxide layer or a vanadium dioxide doped metal element layer.

6. The phase change memory apparatus of claim 5, wherein the metal element is tungsten, niobium, aluminum, or chromium.

7. The phase change memory apparatus of claim 1, further comprising a third circuit configured to apply electrical signals to the at least one heating layer, wherein the third circuit comprises a plurality of first row electrode leads, a plurality of first column electrode leads, a plurality of fifth conducting wires, and a plurality of sixth conducting wires, the plurality of first row electrode leads are substantially parallel to each other and the plurality of first column electrode leads are substantially parallel to each other.

8. The phase change memory apparatus of claim 7, wherein the heating layer comprises a fifth end and a sixth end, the fifth end is electrically connected to the first row electrode leads proximate to the fifth end through the fifth conducting wires, and the sixth end is electrically connected to the first column electrode leads proximate to the sixth end through the sixth conducting wire.

9. The phase change memory apparatus of claim 7, further comprising a fourth circuit configured to apply electrical signals to the at least one phase change layer, wherein the fourth circuit comprises a plurality of second row electrode leads, a plurality of second column electrode leads, a plurality of seventh conducting wires, and a plurality of eighth conducting wires, and the plurality of second row electrode leads are substantially parallel to each other and the plurality of second column electrode leads are substantially parallel to each other.

10. The phase change memory apparatus of claim 9, wherein the phase change layer comprises a seventh end and an eighth end, the seventh end is electrically connected to the second row electrode leads through the seventh conducting wire, and the eighth end is electrically connected to the second column electrode leads through the eighth conducting wire.

11. The phase change memory apparatus of claim 7, wherein two adjacent first row electrode leads and two adjacent first column electrode leads define a first grid, and the at least one heating layer is located in the first grid.

12. The phase change memory apparatus of claim 9, wherein two adjacent second row electrode leads and two adjacent second column electrode leads define a second grid, and the at least one phase change layer is located in the second grid.

13. The phase change memory apparatus of claim 1, wherein each of the at least one phase change layer receives a plurality of electrical signals, and resistance values of the each of the at least one phase change layer are changed in steps, wherein each of the resistance values represents one data.

14. The phase change memory apparatus of claim 1, wherein the at least one heating layer is in direct contact with the at least one phase change layer.

15. The phase change memory apparatus of claim 1, wherein the phase change memory apparatus consists of the at least one heating layer, the at least one phase change layer, a plurality of first power sources, a plurality of second power sources, and a plurality of conducting wires.

16. The phase change memory apparatus of claim 1, wherein the first power source and the second power source are configured for simultaneously working.

17. The phase change memory apparatus of claim 1, wherein the at least one heating layer consists of a plurality of carbon nanotubes.

18. The phase change memory apparatus of claim 1, wherein the first power source and the second power source are two independent power sources.

19. A phase change memory apparatus, comprising:
a phase change layer comprising a vanadium dioxide layer;
a heating layer comprising a plurality of carbon nanotubes, wherein the heating layer is in direct contact with the phase change layer and configured to heat the phase change layer; and
a first power source connected to the heating layer and configured for inputting a writing data in the phase change memory apparatus by supplying a voltage input to the heating layer, and erasing the writing data only by stopping the voltage supplied to the heating layer, so that heat is stopped being transferred to the phase change layer.

20. The phase change memory apparatus of claim 19, wherein the phase change memory apparatus further comprises a second power source connected to the phase change layer, and the first power source and the second power source are configured for operating simultaneously.

* * * * *